United States Patent
Chang et al.

(10) Patent No.: US 6,746,966 B1
(45) Date of Patent: Jun. 8, 2004

(54) METHOD TO SOLVE ALIGNMENT MARK BLINDED ISSUES AND A TECHNOLOGY FOR APPLICATION OF SEMICONDUCTOR ETCHING AT A TINY AREA

(75) Inventors: Chung-Long Chang, Douliou (TW); Henry Lo, Hsinchu (TW); Shang-Ting Tsai, Hsin-Chu (TW); Yu-Liang Lin, Hsin-Chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 10/353,229

(22) Filed: Jan. 28, 2003

(51) Int. Cl.$^7$ ............................................. H01L 21/302
(52) U.S. Cl. ................... 438/734; 438/435; 438/430; 438/427; 438/692; 438/425; 438/700; 438/704
(58) Field of Search ................... 438/756, 692, 438/697, 704, 724, 719, 700, 734, 750, 425, 427, 430, 433, 435

(56) References Cited

U.S. PATENT DOCUMENTS

| | | | |
|---|---|---|---|
| 5,188,258 A | 2/1993 | Iwashita | 222/61 |
| 6,015,744 A | 1/2000 | Tseng | 438/401 |
| 6,043,133 A | 3/2000 | Jang et al. | 438/401 |
| 6,080,635 A | 6/2000 | Jang et al. | 438/401 |
| 6,191,000 B1 * | 2/2001 | Huang et al. | 438/424 |
| 6,194,287 B1 | 2/2001 | Jang | 438/427 |
| 6,329,301 B1 * | 12/2001 | Zahorik et al. | 438/745 |

\* cited by examiner

Primary Examiner—George A. Goudreau
(74) Attorney, Agent, or Firm—George O. Saile; Stephen B. Ackerman; Stephen G. Stanton

(57) ABSTRACT

A method of unblinding an alignment mark comprising the following steps. A substrate having a cell area and an alignment mark within an alignment area is provided. An STI trench is formed into the substrate within the cell area. A silicon oxide layer is formed over the substrate, filling the STI trench and the alignment mark. The silicon oxide layer is planarized to form a planarized STI within the STI trench and leaving silicon oxide within the alignment mark to form a blinded alignment mark. A wet chemical etchant is applied within the alignment mark area over the blinded alignment mark to at least partially remove the silicon oxide within the alignment mark. The remaining silicon oxide is removed from within the blinded alignment mark to unblind the alignment mark. A drop etcher apparatus is also disclosed.

40 Claims, 5 Drawing Sheets

METHOD TO SOLVE ALIGNMENT MARK BLINDED ISSUES AND A TECHNOLOGY FOR APPLICATION OF SEMICONDUCTOR ETCHING AT A TINY AREA

FIELD OF THE INVENTION

The present invention relates generally to semiconductor fabrication and more specifically to alignment marks and semiconductor etching at tiny areas.

BACKGROUND OF THE INVENTION

Alignment marks are used to permit precise alignment of photolithographic masks with the wafer during masking steps to minimize misalignment between multiple layers. However, the alignment marks are 'blinded' after non-ODR shallow trench isolation (STI) chemical mechanical polishing (CMP) processes. This prevents transfer of the lower alignment mark to the next, upper layer, for example a metal layer.

An additional photolithography and etching step (ODR) are required to clear out the silicon oxide residue from the 'blinded' alignment mark field. This increases costs, increases the cycle time and manufacture loading. Further, the ODR approach is limited by the circuit design rule especially as the design rule passes 0.1 $\mu$m logic and beyond.

Blind alignment marks will become a critical issue in non-OD reverse tone photo/etch (ODR) processes after 0.1 $\mu$m and beyond shallow trench isolation (STI) CMP.

U.S. Pat. No. 6,194,287 B1 to Jang et al. describes an STI process and reverse mask to clear off alignment marks.

U.S. Pat. No. 6,080,635 to Jang et al. describes discloses a method to preserve alignment marks with STI processes.

U.S. Pat. No. 6,043,133 to Jang et al. describes a process to improve STI removal over alignment marks.

U.S. Pat. No. 6,015,744 to Tseng describes a clear out and alignment mark process.

U.S. Pat. No. 5,188,258 to Iwashita describes a quantitative fluid discharge device.

SUMMARY OF THE INVENTION

Accordingly, it is an object of one or more embodiments of the present invention to provide an improved method of unblinding alignment marks.

Other objects will appear hereinafter.

It has now been discovered that the above and other objects of the present invention may be accomplished in the following manner. Specifically, a substrate having a cell area and an alignment mark area is provided. The substrate having an alignment mark within the alignment mark area. An STI trench is formed into the substrate within the cell area. A silicon oxide layer is formed over the substrate, filling the STI trench and the alignment mark. The silicon oxide layer is planarized to form a planarized STI within the STI trench and leaving silicon oxide within the alignment mark to form a blinded alignment mark. A wet chemical etchant is applied within the alignment mark area over the blinded alignment mark to at least partially remove the silicon oxide within the alignment mark. The remaining silicon oxide is removed from within the blinded alignment mark to unblind the alignment mark. A drop etcher apparatus is also disclosed.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DESCRIPTION OF THE PREFERRED EMBODIMENT

The inventors have discovered a novel method to solve the alignment mark (AM) blinding issues that includes using a wet chemical solution to partially remove the oxide residue within the blinded alignment marks after STI CMP processing. Furthermore, the wet chemical solution oxide residue removal easily integrates into the subsequent silicon nitride ($Si_3N_4$ or SiN) strip step.

Initial Structure

Figure 1:
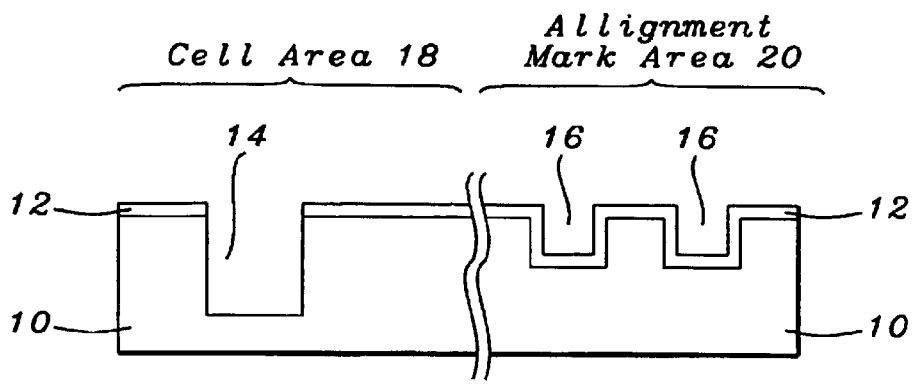
FIGS. 1 to 6 schematically illustrate a preferred embodiment of the present invention.
Figure 2:
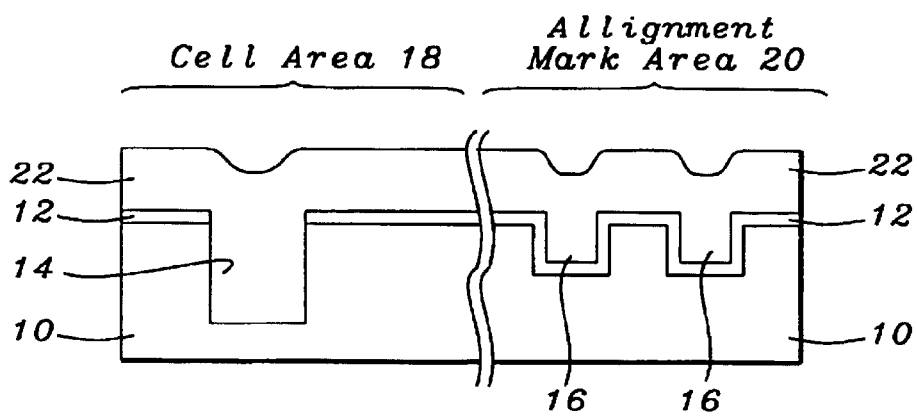
Figure 3:
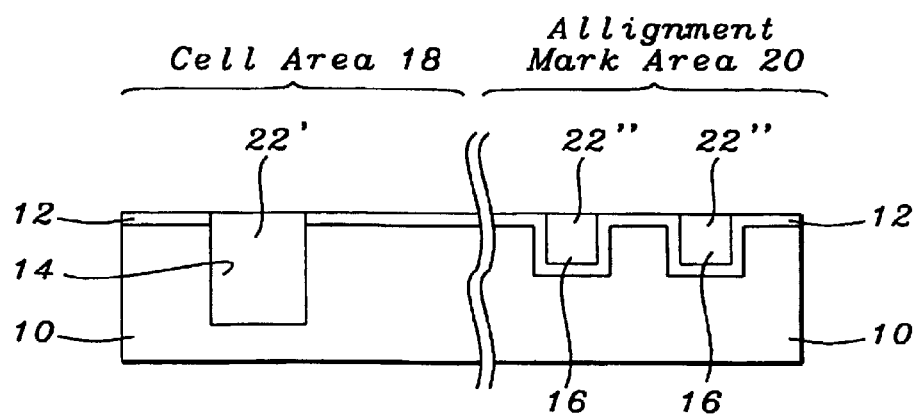

As shown in FIG. 1, structure 10 is preferably a silicon substrate and includes an overlying layer 12 lining alignment marks 16 within alignment mark area 20. Layer 12 is preferably comprised of silicon nitride ($Si_3N_4$ or SiN) or polysilicon (having a thickness of from about 500 to 2000 Å) and is more preferably SiN as will be used for illustrative purposes hereafter. SiN layer 12 is preferably from about 100 to 2000 Å and more preferably from about 800 to 1100 Å thick.

Alignment marks 16 have a depth of preferably from about 1150 to 1250 Å and more preferably about 1200 Å. Alignment marks 16 have a width of preferably from about 7.8 to 8.2 $\mu$m and more preferably about 8.0 $\mu$m.

A shallow trench isolation (STI) opening 14 is formed through the SiN layer 12 and into silicon substrate 10 within cell area 18 that is spaced apart form alignment mark area 20.

Formation of Oxide Layer 22

To form the STI, a silicon oxide (oxide) layer 22 is formed over silicon substrate 10, filling STI trench 14 and alignment marks 16. Alignment marks 16 are filled by oxide layer 22 and by the oxide residue formed by the CMP of oxide layer 22 to form planarized STI layer 22' (see below).

Planarization of Oxide Layer 22

Oxide layer 22 is then planarized, preferably by a chemical mechanical polishing (CMP) process to form planarized STI 22' and filling (and 'blinding') alignment marks 16 with oxide 22",

Use of Drop Etcher 40

Figure 4:
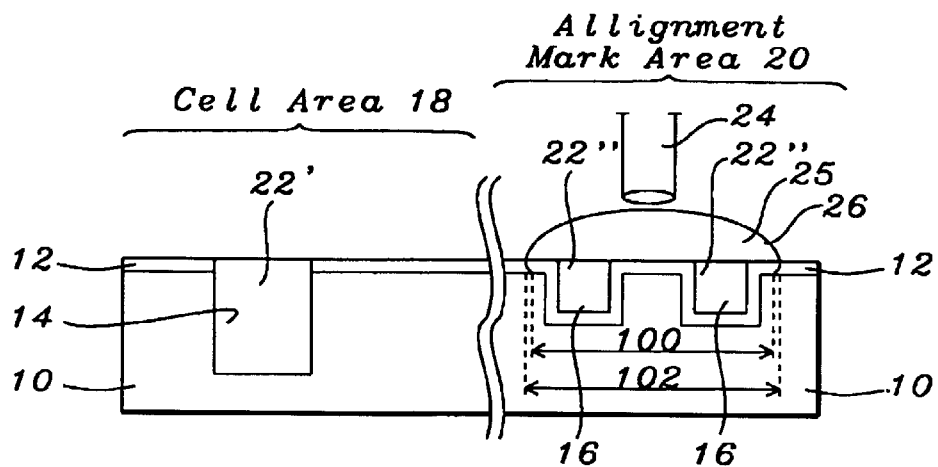

As shown in FIG. 4, a drop etcher 40 (such as that shown in FIG. 7) is aligned and used to dispense a wet etching chemical 25 in the form of a drop 26 only over the oxide filled 22" alignment marks 16 within alignment mark area 20. The planarized STI 22' is not contacted with, or affected by, wet etching chemical 25. The tip 24 of drop etcher 40 is aligned with the 'blinded' alignment marks 16 by finding water notch or by pattern recognition (align cell pattern).

Wet etching chemical 25 is preferably hydrogen fluoride (HF) or buffered oxide etchant (BOE). If BOE is used, it has an oxide: SiN etching sensitivity of about 10:1 with an oxide etching rate of about 1400 Å/min. If HF is used, it has an oxide: SiN etching sensitivity of about 15:1 with an oxide etching rate of about 9000 Å/min.

Figure 7:
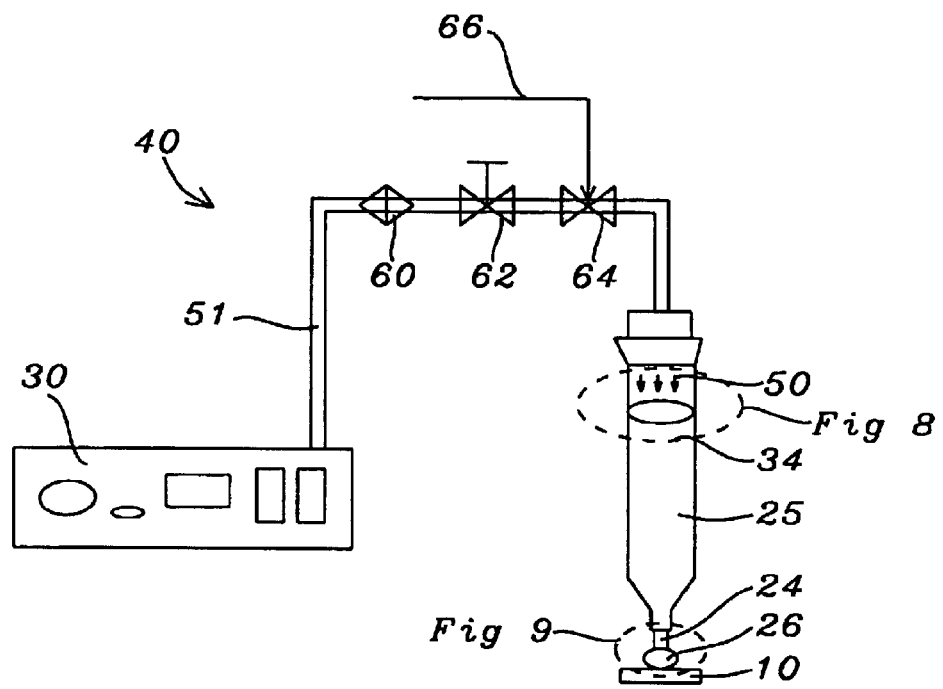
FIG. 7 schematically illustrates a drop etcher used with the preferred embodiment of the present invention.
Figure 8:
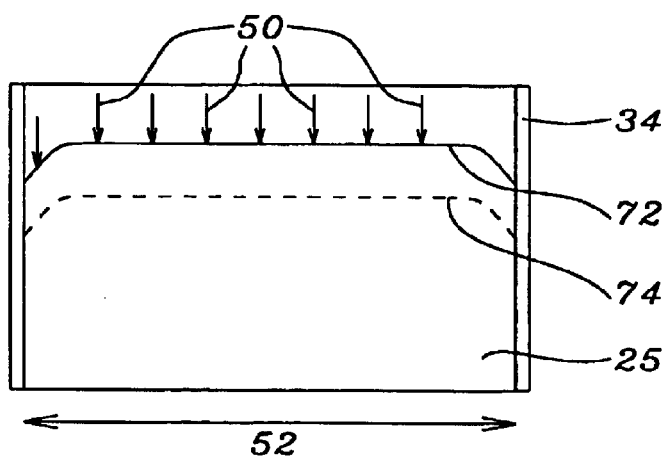
FIG. 8 is an enlarged cross-section of FIG. 7 taken at the dashed circle labeled "FIG. 8."
Figure 9:
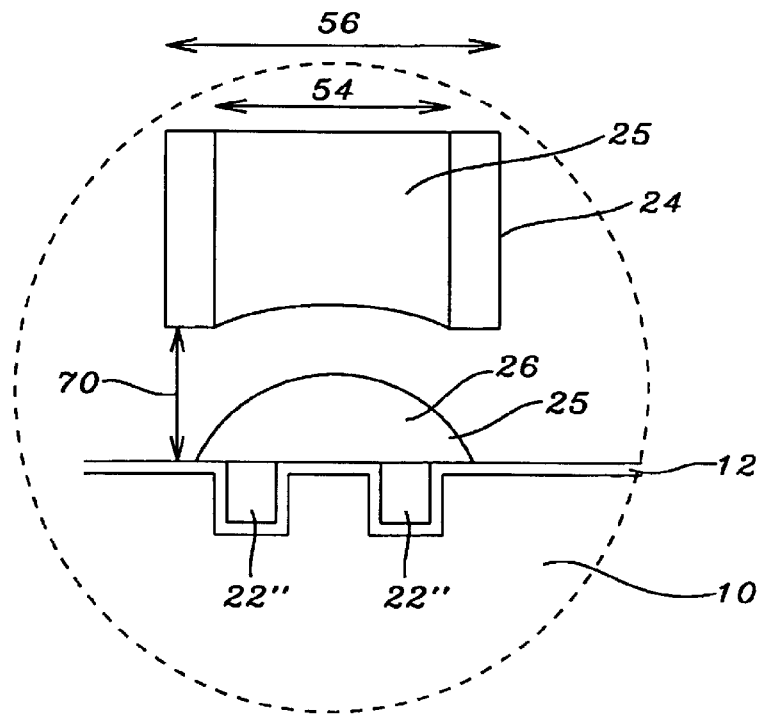
FIG. 9 is an enlarged cross-section of FIG. 7 taken at the dashed circle labeled "FIG. 9."

As shown in FIGS. 7 to 9, drop etcher 40 may include a control unit 30 that dispenses a measured amount of wet etching chemical 25, preferably in the form of a drop 26, from within dispenser tube 34 (having inside diameter 52) through tip 24 to wafer 10 by using pressure 50.

Line 51 connects control unit 30 to the upper portion of dispenser tube 34 and through which line 51 a gas, such as preferably air or nitrogen ($N_2$), is pulsed through a filter 60, a pressure regulator 62 and a high-speed shut-off valve 64 controlled 66 by the controller 30 or a timer.

Figure 10A:
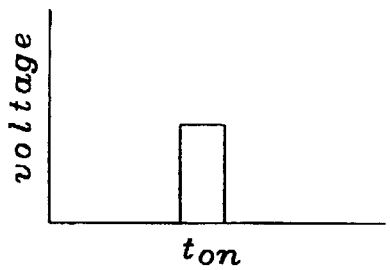
FIGS. 10a, 10b and 10c are respective graphs of: voltage vs. time on of the signal from the controller; pressure vs. time; and the chemical drop vs. time.
Figure 10B:
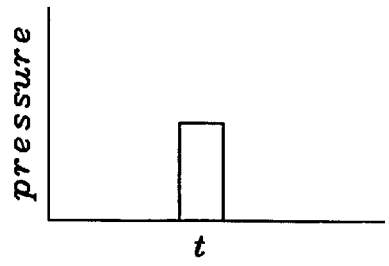
Figure 10C:
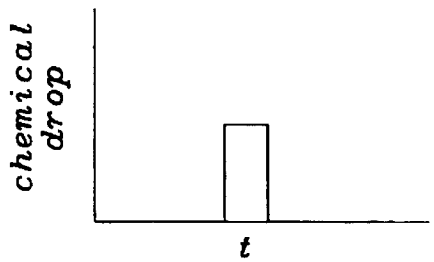

FIGS. 10a, 10b and 10c respectively illustrate: voltage vs. the amount of time on $t_{on}$ of the signal 66 from the controller 30 or a timer; pressure vs. time; and the chemical drop 26 vs. time wherein:

chemical drop 26=($t_{on}$*XrXp*)

* $t_{on}$: time on of the signal 66 from controller 30 or timer
** r: shut-off valve 64 radius
*** p: gas pressure after the pressure regulator 62 with the shut-off valve 64 radius (r) being preferably from about 0.05 to 5.00 mm and is more preferably from about 0.01 to 8.00 mm.

The time control is preferably from about 0.001 to 10.000 seconds and more preferably from about 0.001 to 5.000 seconds; the pressure control is preferably from about 0.001 to 10.000 psi and more preferably from about 0.001 to 5.000 psi; the tip 24 inside diameter 54 is preferably from about 0.01 to 2.00 mm and more preferably from about 0.10 to 1.00 mm; and the dispenser distance 70 is preferably from about 1.0 μm to 1.0 cm and more preferably from about 0.5 to 6.0 mm.

As illustrated in FIGS. 8 and 9 (and see FIG. 4), upon the application of gas pressure 50 onto the upper surface 72 of the chemical 25 within the dispenser tube 34, the pressure 50 of the gas expels a portion of the chemical 25 through the drop etcher tip 24 to form a drop 26 as the level of the chemical 25 within the dispenser tube 34 is lowered to the dashed upper surface line 74.

By the precise control of the gas pressure, time and size of the tips and nozzles involved, consistent deposits are ensured with a sped-up output while maintaining high quality and reduced waste. By increasing either the gas pressure, the time duration or the tip gauge (inside diameter 54), the size of the drop and hence the etch size will increase.

The tip 24 is preferably comprised of a non-reactive material such as polytetrafluorethylene (PTFE), perfluoroalkoxy (PFA), or polyvinyl chloride (PVC). For wet dip process optimization, the tip 24 preferably has: an outer diameter 56 of preferably from about 0.5 to 3.0 mm and more preferably about 1.0 mm; and an inner diameter 54 of preferably from about 0.5 to 0.7 mm and more preferably about 0.5 mm.

The tip 24 is preferably spaced from the upper surface of the structure 10 a dispenser distance 70 of preferably from about 1 μm to 1 cm and more preferably from about 0.5 mm to 6.0 mm.

In real process control, the drop 26 has an inner diameter 100 of from about 0.1 to 0.7 mm and an outer diameter of from about 1.0 to 3.0 mm (see FIG. 4).This ensures that the wet etching chemical drop 26 covers the oxide 22" filled alignment marks 16 within alignment mark area 20 without impinging upon the cell area 18 and the STI 22'.

Etching of Oxide 22" Within Alignment Marks 16

Figure 5:
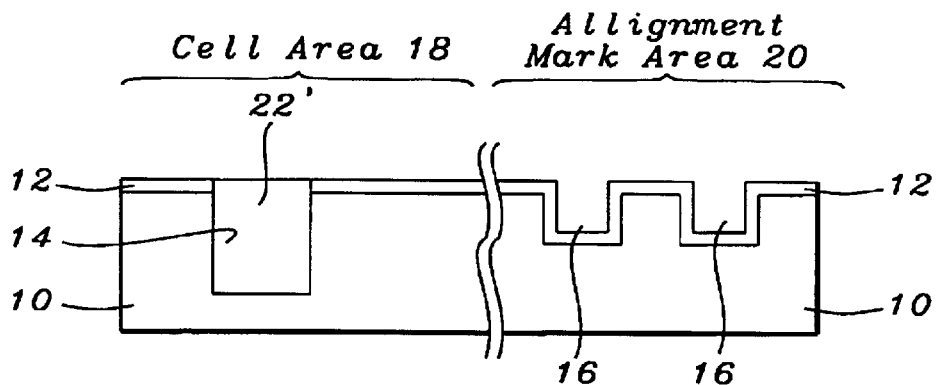

As shown in FIG. 5, the etching chemical drop 26 etches the oxide 22" within alignment marks 16 so that preferably from about 80 to 90% of the oxide 22" within alignment marks 16 is removed and more preferably from about 85 to 90% in from about 10 to 100 seconds and more preferably from about 30 to 45 seconds.

The remainder of drop 26 is removed before the SiN strip step (see below).

SiN Layer 12 Strip

Figure 6:
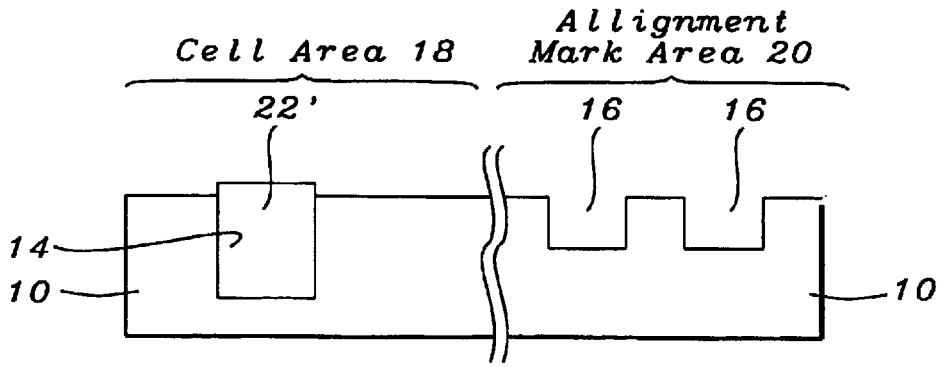

As shown in FIG. 6, SiN layer 12 is then stripped and removed from silicon substrate 10 and from within alignment marks 16 using a SiN stripping process that is preferably a wet bench clean process. This also removes any remaining oxide 22" from alignment marks 16 and any wet etching chemical 25/oxide 22 residue from silicon substrate 10. The SiN stripping process preferably uses $H_3PO_4$.

Thus, alignment marks 16 are now clear and transparent to the next formed layer, such as a metal layer, so that the alignments marks 16 are transferred to the upper, next formed layer and may be readily observed for continued fabrication.

Figure 11A:
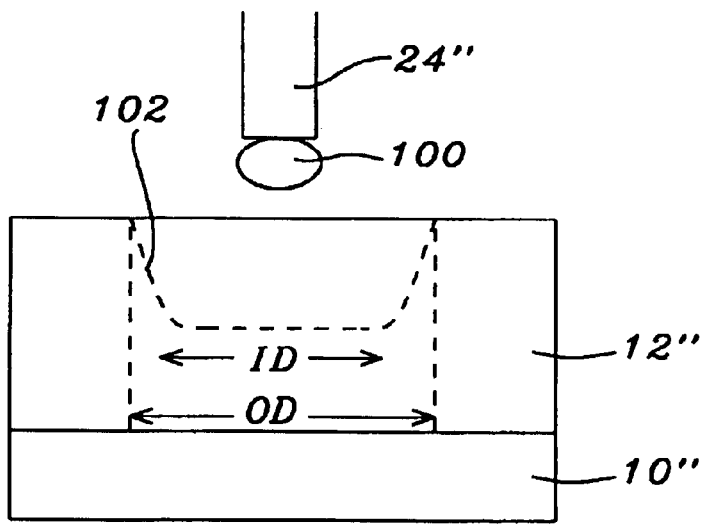
FIG. 11A is an enlarged schematic representation of a portion the drop etcher illustrated in FIG. 7 used with a blanket wafer monitor.

FIG. 11A is an enlarged schematic representation of a portion the drop etcher 24" illustrated in FIG. 7 illustrating the inside diameter (ID) and outside diameter (OD) of an etched opening 102 shown in dashed line after a drop 100 from drop etcher 24" is released from drop etcher 24" onto a monitor wafer's oxide layer 12" over silicon substrate 10". The ID and OD are plotted in FIG. 11B (see below).

Figure 11B:
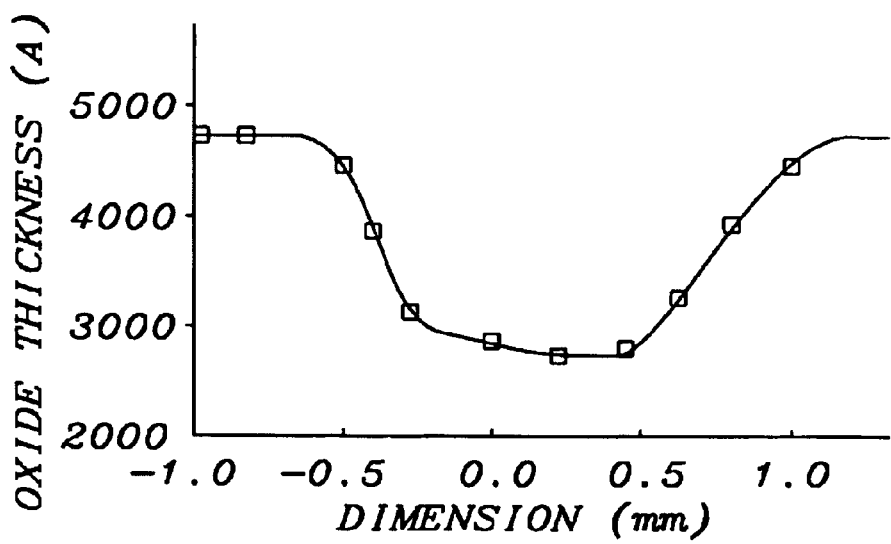
FIG. 11B is a graph of an etching profile of a blanket wafer monitor.

FIG. 11B is a graph of blanket wafer monitor etch rate and etch profile (not in real application) where CPVC is chlorinated polyvinyl chloride and the mean of BOE of 2:1 is a mixed ratio of about 40% $NH_4F$ to about 49% HF 2:1.

Advantages of the Present Invention

The advantages of one or more embodiments of the present invention include:
1. saves the time and expense of an additional ODR;
2. the method is simple and inexpensive;
3. the method is easy to integrate with the SiN stripping process;
4. current dispenser technology is available for the drop technology used in the present invention; and
5. increase STI CMP process merge.

While particular embodiments of the present invention have been illustrated and described, it is not intended to limit the invention, except as defined by the following claims.

We claim:
1. A method of unblinding an alignment mark, comprising the steps of:
providing a substrate having a cell area and an alignment mark area; the substrate having an alignment mark within the alignment mark area:
forming an STI trench into the substrate within the cell area;
forming a silicon oxide layer over the substrate, filling the STI trench and the alignment mark;

planarizing the silicon oxide layer to form a planarized STI within the STI trench and leaving silicon oxide within the alignment mark to form a blinded alignment mark;

applying a wet chemical etchant within the alignment mark area over the blinded alignment mark to at least partially remove the silicon oxide within the alignment mark; and removing the remaining silicon oxide from within the blinded alignment mark to unblind the alignment mark; wherein the wet chemical etchant is applied to the blinded alignment mark in the form of a drop.

2. The method of claim 1, including the step of forming a layer over the substrate and lining the alignment mark before the formation of the STI trench into the substrate.

3. The method of claim 1, wherein the structure is a semiconductor substrate.

4. The method of claim 1, wherein the structure is comprised of silicon.

5. The method of claim 1, including the step of forming a layer over the substrate and lining the alignment mark before the formation of the STI trench into the substrate; wherein the structure is comprised of silicon and the layer is comprised of a material selected from the group consisting of: SiN and polysilicon.

6. The method of claim 1, including the step of forming a layer over the substrate and lining the alignment mark before the formation of the STI trench into the substrate; wherein the structure is comprised of silicon and the layer is comprised of a material selected from the group consisting of: SiN.

7. The method of claim 1, including the step of forming a layer over the substrate and lining the alignment mark before the formation of the STI trench into the substrate; wherein the layer is comprised of SiN and is from about 100 to 2000 Å thick and the alignment mark has a depth of from about 1150 to 1250 Å and a width of from about 7.8 to 8.2 µm.

8. The method of claim 1, including the step of forming a layer over the substrate and lining the alignment mark before the formation of the STI trench into the substrate; wherein the layer is comprised of SiN and is from about 800 to 1100 Å thick and the alignment mark has a depth of about 1200 Å and a width of about 8.0 µm.

9. The method of claim 1, wherein the silicon oxide layer is planarized by chemical mechanical polishing.

10. The method of claim 1, wherein the wet chemical etchant is comprised of a chemical selected from the group consisting of HF and BOE.

11. The method of claim 1, wherein the wet chemical etchant is applied to the blinded alignment mark from a drop etcher.

12. The method of claim 1, wherein the wet chemical etchant is applied to the blinded alignment mark from a drop etcher having a tip with an inner diameter of from about 0.5 to 0.7 mm.

13. The method of claim 1, wherein from about 80 to 90% of the silicon oxide is removed from the blinded alignment mark by the wet chemical etchant.

14. The method of claim 1, wherein from about 85 to 90% of the silicon oxide is removed from the blinded alignment mark by the wet chemical etchant.

15. The method of claim 1, including the step of forming a layer over the substrate and lining the alignment mark before the formation of the STI trench into the substrate; wherein the layer is comprised of SiN and is removed by a wet bench clean process.

16. The method of claim 1, wherein the wet chemical etchant is applied to the blinded alignment mark in the form of a drop from a drop etcher dispenser tube; the drop being dispensed from the dispenser tube through the application of gas pressure.

17. The method of claim 1, wherein the wet chemical etchant is applied to the blinded alignment mark in the form of a drop from a drop etcher dispenser tube; the drop being dispensed from the dispenser tube through the application of gas pressure; the gas pressure being applied through a high speed shut-off valve from a gas source.

18. The method of claim 1, wherein the wet chemical etchant is applied to the blinded alignment mark in the form of a drop from a drop etcher dispenser tube; the drop being dispensed from the dispenser tube through the timed application of gas pressure; the gas pressure being applied through a high speed shut-off valve from a gas source; the shut-off valve having a radius; the amount of the drop equal to the length of the timed application of the gas pressure multiplied by the radius of the shut-off valve multiplied by the amount of the gas pressure.

19. The method of claim 1, wherein the wet chemical etchant is applied to the blinded alignment mark in the form of a drop from a drop etcher dispenser tube; the drop being dispensed from the dispenser tube through the timed application of gas pressure; the gas pressure being applied through a high speed shut-off valve from a gas source; the shut-off valve having a radius; the amount of the drop equal to the length of the timed application of the gas pressure multiplied by the radius of the shut-off valve multiplied by the amount of the gas pressure;

the length of the timed application of the gas pressure being from about 0.001 to 5.000 seconds;

the radius of the shut-off valve being from about 0.05 to 5.00 mm; and the amount of the gas pressure being from about 0.001 to 5.000 psi.

20. The method of claim 1, wherein the wet chemical etchant is applied to the blinded alignment mark in the form of a drop from a drop etcher dispenser tube; the drop being dispensed from the dispenser tube through the timed application of gas pressure; the gas pressure being applied through a high speed shut-off valve from a gas source; the shut-off valve having a radius; the amount of the drop equal to the length of the timed application of the gas pressure multiplied by the radius of the shut-off valve multiplied by the amount of the gas pressure;

the length of the timed application of the gas pressure being from about 0.001 to 10.000 seconds;

the radius of the shut-off valve being from about 0.05 to 5.00 mm; and the amount of the gas pressure being from about 0.01 to 10.00 psi.

21. The method of claim 1, wherein the wet chemical etchant is applied to the blinded alignment mark in the form of a drop from a drop etcher dispenser tube; the drop being dispensed from the dispenser tube through the application of gas pressure through a pressure regulator and a high-speed valve.

22. A method of unblinding an alignment mark, comprising the steps of:
  providing a substrate having a cell area and an alignment mark area; the substrate having an alignment mark within the alignment mark area;
  forming an SiN layer over the substrate and lining the alignment mark;
  forming an STI trench through the SiN layer and into the substrate within the cell area;
  forming a silicon oxide layer over the substrate, filling the STI trench and the SiN layer lined alignment mark;
  planarizing the silicon oxide layer to form a planarized STI within the STI trench and leaving silicon oxide within the alignment mark to form a blinded alignment mark;
  applying a wet chemical etchant within the alignment mark area over the blinded alignment mark to at least partially remove the silicon oxide within the alignment mark; and
  removing the SiN layer from over the substrate and within SiN layer lined alignment mark whereby the silicon oxide is also removed from within the blinded alignment mark to unblind the alignment mark; wherein the wet chemical etchant is applied to the blinded alignment mark in the form of a drop.

23. The method of claim 22, wherein the substrate is a semiconductor substrate.

24. The method of claim 22, wherein the substrate is comprised of silicon.

25. The method of claim 22, wherein the alignment mark has a depth of from about 1150 to 1250 Å and a width of from about 7.8 to 8.2 μm.

26. The method of claim 22, wherein the SiN layer is from about 100 to 2000 Å thick.

27. The method of claim 22, wherein the silicon oxide layer is planarized by chemical mechanical polishing.

28. The method of claim 22, wherein the wet chemical etchant is comprised of a chemical selected from the group consisting of HF and BOE.

29. The method of claim 22, wherein the silicon oxide layer is planarized by chemical mechanical polishing and the wet chemical etchant is comprised of a chemical selected from the group consisting of HF and BOE.

30. The method of claim 22, wherein the wet chemical etchant is applied to the blinded alignment mark from a drop etcher.

31. The method of claim 22, wherein the wet chemical etchant is applied to the blinded alignment mark from a drop etcher having a tip with an inner diameter of from about 0.5 to 0.7 mm.

32. The method of claim 22, wherein from about 80 to 90% of the silicon oxide is removed from the blinded alignment mark by the wet chemical etchant.

33. The method of claim 22, wherein from about 85 to 90% of the silicon oxide is removed from the blinded alignment mark by the wet chemical etchant in from about 10 to 100 seconds.

34. The method of claim 22, wherein the SiN layer and is removed by a wet bench clean process.

35. The method of claim 22, wherein the wet chemical etchant is applied to the blinded alignment mark in the form of a drop from a drop etcher dispenser tube; the drop being dispensed from the dispenser tube through the application of gas pressure.

36. The method of claim 22, wherein the wet chemical etchant is applied to the blinded alignment mark in the form of a drop from a drop etcher dispenser tube; the drop being dispensed from the dispenser tube through the application of gas pressure; the gas pressure being applied through a high speed shut-off valve from a gas source.

37. The method of claim 22, wherein the wet chemical etchant is applied to the blinded alignment mark in the form of a drop from a drop etcher dispenser tube; the drop being dispensed from the dispenser tube through the timed application of gas pressure; the gas pressure being applied through a high speed shut-off valve from a gas source; the shut-off valve having a radius; the amount of the drop equal to
  the length of the timed application of the gas pressure multiplied by
  the radius of the shut-off valve multiplied by
  the amount of the gas pressure.

38. The method of claim 22, wherein the wet chemical etchant is applied to the blinded alignment mark in the form of a drop from a drop etcher dispenser tube; the drop being dispensed from the dispenser tube through the timed application of gas pressure; the gas pressure being applied through a high speed shut-off valve from a gas source; the shut-off valve having a radius; the amount of the drop equal to
  the length of the timed application of the gas pressure multiplied by
  the radius of the shut-off valve multiplied by
  the amount of the gas pressure;
  the length of the timed application of the gas pressure being from about 0.001 to 5.000 seconds;
  the radius of the shut-off valve being from about 0.05 to 5.00 mm; and
  the amount of the gas pressure being from about 0.001 to 5.000 psi.

39. The method of claim 22, wherein the wet chemical etchant is applied to the blinded alignment mark in the form of a drop from a drop etcher dispenser tube; the drop being dispensed from the dispenser tube through the timed application of gas pressure; the gas pressure being applied through a high speed shut-off valve from a gas source; the shut-off valve having a radius; the amount of the drop equal to
  the length of the timed application of the gas pressure multiplied by
  the radius of the shut-off valve multiplied by
  the amount of the gas pressure;
  the length of the timed application of the gas pressure being from about 0.001 to 10.000 seconds;
  the radius of the shut-off valve being from about 0.05 to 5.00 mm; and
  the amount of the gas pressure being from about 0.001 to 10.000 psi.

40. The method of claim 22, wherein the wet chemical etchant is applied to the blinded alignment mark in the form of a drop from a drop etcher dispenser tube; the drop being dispensed from the dispenser tube through the application of gas pressure through a pressure regulator and a high-speed valve.

* * * * *